(12) United States Patent
Iwamiya et al.

(10) Patent No.: US 7,280,368 B2
(45) Date of Patent: Oct. 9, 2007

(54) EMI SHIELDING TECHNIQUES USING MULTIPLE EMI SHIELDS WHICH SHARE THE SAME CIRCUIT BOARD HOLES

(75) Inventors: Edward Iwamiya, Petaluma, CA (US); John Hanners, Cotati, CA (US)

(73) Assignee: Cisco Technology, Inc., San Jose, CA (US)

( * ) Notice: Subject to any disclaimer, the term of this patent is extended or adjusted under 35 U.S.C. 154(b) by 61 days.

(21) Appl. No.: 11/238,249

(22) Filed: Sep. 29, 2005

(65) Prior Publication Data

US 2007/0081311 A1   Apr. 12, 2007

(51) Int. Cl.
 *H05K 7/02* (2006.01)
(52) U.S. Cl. .................. 361/760; 361/818; 174/377
(58) Field of Classification Search ............... 361/760, 361/818, 816; 174/377, 382
 See application file for complete search history.

(56) References Cited

U.S. PATENT DOCUMENTS 6,653,557 B2  11/2003  Wolf et al. .............. 174/386
6,720,493 B1  4/2004  Strobel et al. ........... 174/388
6,866,544 B1  3/2005  Casey et al. ............. 439/607
7,085,142 B2 *  8/2006  Berberich ................ 361/818

* cited by examiner

*Primary Examiner*—Javaid H. Nasri
(74) *Attorney, Agent, or Firm*—BainwoodHuang

(57) ABSTRACT

A circuit board module includes a circuit board defining a top side, a bottom side and holes extending through the circuit board between the top and bottom sides. The module further includes a component mounted to a portion of the circuit board, and an EMI shield assembly configured to provide EMI shielding on the circuit board. The EMI shield assembly includes a top shield and a bottom shield. The top and bottom shields are configured to substantially enclose the portion of the circuit board and the component to provide EMI shielding when (i) contacts of the top shield insert into the holes defined by the circuit board in a first direction from the top side toward the bottom side, and (ii) contacts of the bottom shield simultaneously insert into the same holes defined by the circuit board in a second direction from the bottom side toward the top side.

19 Claims, 6 Drawing Sheets

EMI SHIELDING TECHNIQUES USING MULTIPLE EMI SHIELDS WHICH SHARE THE SAME CIRCUIT BOARD HOLES

BACKGROUND

One conventional circuit board assembly includes a circuit board, a circuit board component, and a metallic electromagnetic interference (EMI) cover which fits over the circuit board component and attaches to the circuit board. When the EMI cover is properly in place over the circuit board and the circuit board component, the EMI cover operates as an EMI barrier for the top and sides of the circuit board component. Additionally, a ground plane within the circuit board operates as another EMI barrier for the bottom of the circuit board component. As a result, EMI from the component location can be kept at acceptable levels, and the likelihood of such EMI causing malfunctions is significantly reduced.

The EMI cover typically includes a metallic pan-shaped section, and multiple metallic posts which extend from the periphery of the metallic pan-shaped section. The multiple metallic posts insert into a set of plated through holes (PTHs) of the circuit board which extend around the component mounting location.

In some situations, the manufacturer may solder the posts to the PTHs. To prevent solder from reflowing and possibly forming a solder short between two PTHs, or between a PTH and a neighboring metallic structure (e.g., a mounting pad which connects to the circuit board component), the manufacturer may set various standards or rules such as a requirement that there be a 0.200 inch clearance between the PTHs and the mounting pads, e.g., Surface Mount Technology (SMT) pads.

SUMMARY

Unfortunately, there are deficiencies to the above-described conventional approach to maintaining EMI from a circuit board component at acceptable levels. For example, the above-described approach requires the use of a ground plane within the circuit board to block EMI from escaping from the bottom side of the component and the component mounting location. However, the ground plane may be riddled with vias that connect the mounting pads of the circuit board to internal signal traces and the associated anti-pads (i.e., the "keep out" regions which encircle the vias). Since the anti-pads may be somewhat large and since the vias typically extend completely through the circuit board, the ground plane within the circuit board provides a poor EMI seal and EMI can easily escape therethrough. That is, the ground plane is not very well-suited to operate as an EMI barrier and unfortunately may be a prime source of EMI leakage.

Additionally, if a manufacturer were to consider mounting another EMI cover to the underside of the component mounting location, the manufacturer might consider installing a second set of PTHs around the first set of PTHs used by the first EMI cover. The manufacturer could then attach the other EMI cover to the second set of PTHs. However, this would be an inefficient use of circuit board real estate since now the. manufacturer would now need to provide an additional 0.200 inch clearance for the second set of PTHs around the first set of PTHs, i.e., further consumption of circuit board real estate.

Alternatively, the manufacturer might consider leaving the circuit board as is, and simply use half of the existing set of PTHs which are currently used by the first EMI cover. Here, the manufacturer redesigns the first EMI cover so that it has fewer metallic posts (i.e., half the original number of posts) and thus attaches to the circuit board through fewer PTHs. The other EMI cover can then attach to the circuit board through the remaining PTHs. Unfortunately, the redesigned EMI cover is would have weaker EMI sealing capabilities since that EMI cover would now have less metallic posts and thus be in less communication with the circuit board.

In contrast to the above-described conventional approach to keeping EMI from a circuit board component at an acceptable level using a single EMI cover or the above-described possible alternatives, embodiments of the invention are directed to EMI shielding techniques which utilize a top shield and a bottom shield that share the same set of circuit board holes (e.g., plated through holes). Such techniques enable robust EMI shielding while minimizing circuit board intrusion.

One embodiment is directed to a circuit board module which includes a circuit board defining a top side, a bottom side and a set of holes extending through the circuit board between the top side and the bottom side. The circuit board module further includes a circuit board component mounted to a portion of the circuit board, and an EMI shield assembly configured to provide EMI shielding on the circuit board. The EMI shield assembly includes a top shield and a bottom shield. The top shield and the bottom shield are configured to substantially enclose the portion of the circuit board and the circuit board component to provide EMI shielding substantially around the portion of the circuit board and the component when (i) contacts (e.g., sockets or pins) of the top shield insert into the set of holes defined by the circuit board in a first direction from the top side toward the bottom side, and (ii) contacts (e.g., pins or sockets)-of the bottom shield simultaneously insert into the same set of holes defined by the circuit board in a second direction from the bottom side toward the top side.

In some arrangements, the top and bottom shields are configured as press-fit EMI cans. For such arrangements, removal for manufacturing rework is simple and straight forward in contrast to a conventional single-piece wave solder can which is soldered to the circuit board. In particular, to remove the top and bottom press-fit shields from a circuit board, a simple tool (e.g., a screwdriver, an extraction tool specialized not to damage the circuit board, etc.) can be used to pry off the top and bottom press-fit shields at designated locations. The per pin forces would be low enough that no special fixture would be required for removal.

BRIEF DESCRIPTION OF THE DRAWINGS

The foregoing and other objects, features and advantages of the invention will be apparent from the following description of particular embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

Embodiments of the invention are directed to electromagnetic interference (EMI) shielding techniques which utilize a top shield and a bottom shield that attach to a circuit board using the same set of circuit board holes. Such techniques enable robust EMI shielding while minimizing consumption of circuit board real estate.

Figure 1:
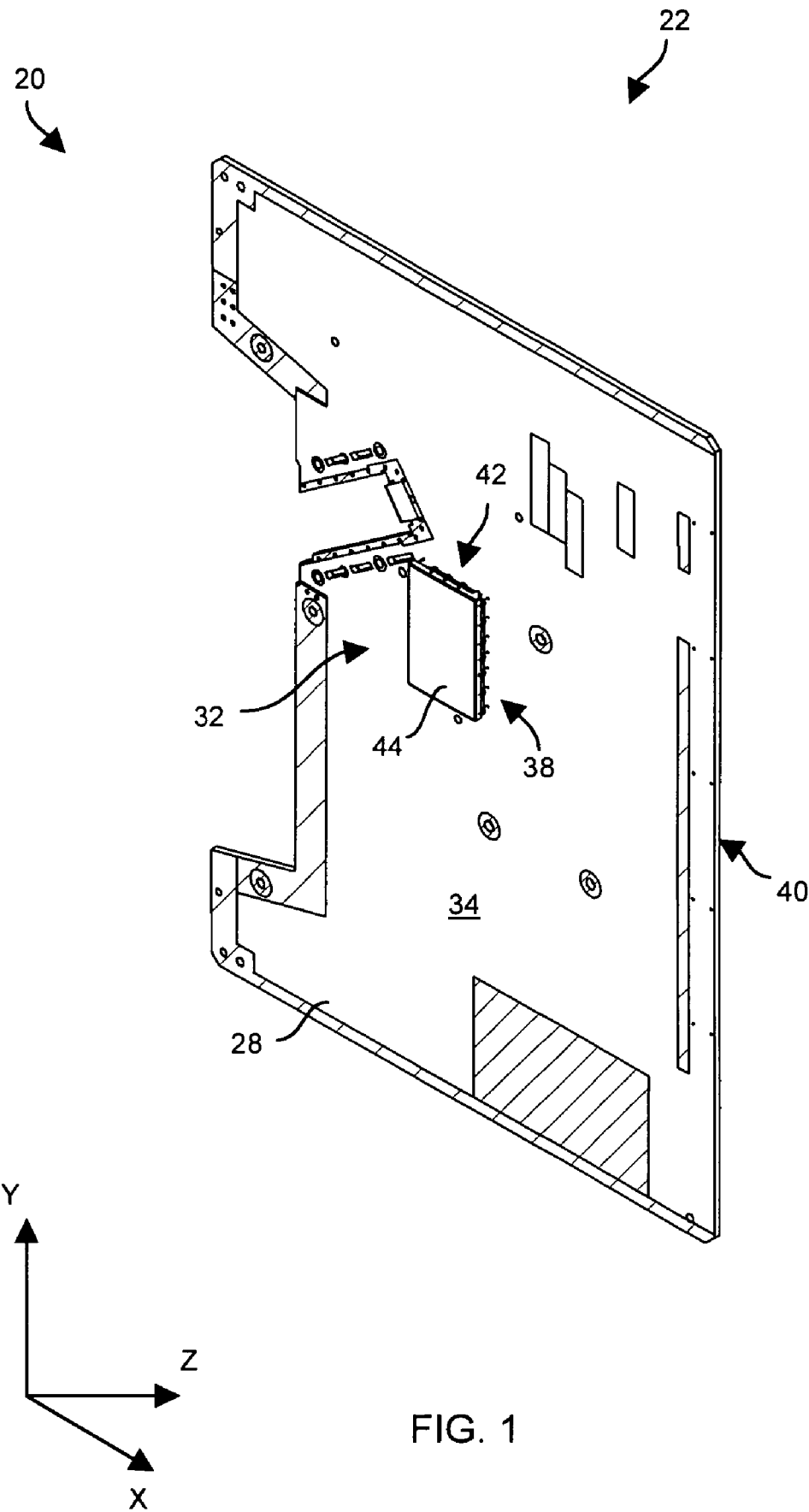
FIG. 1 is a perspective view of the top of a circuit board module having multiple EMI shields.
Figure 2:
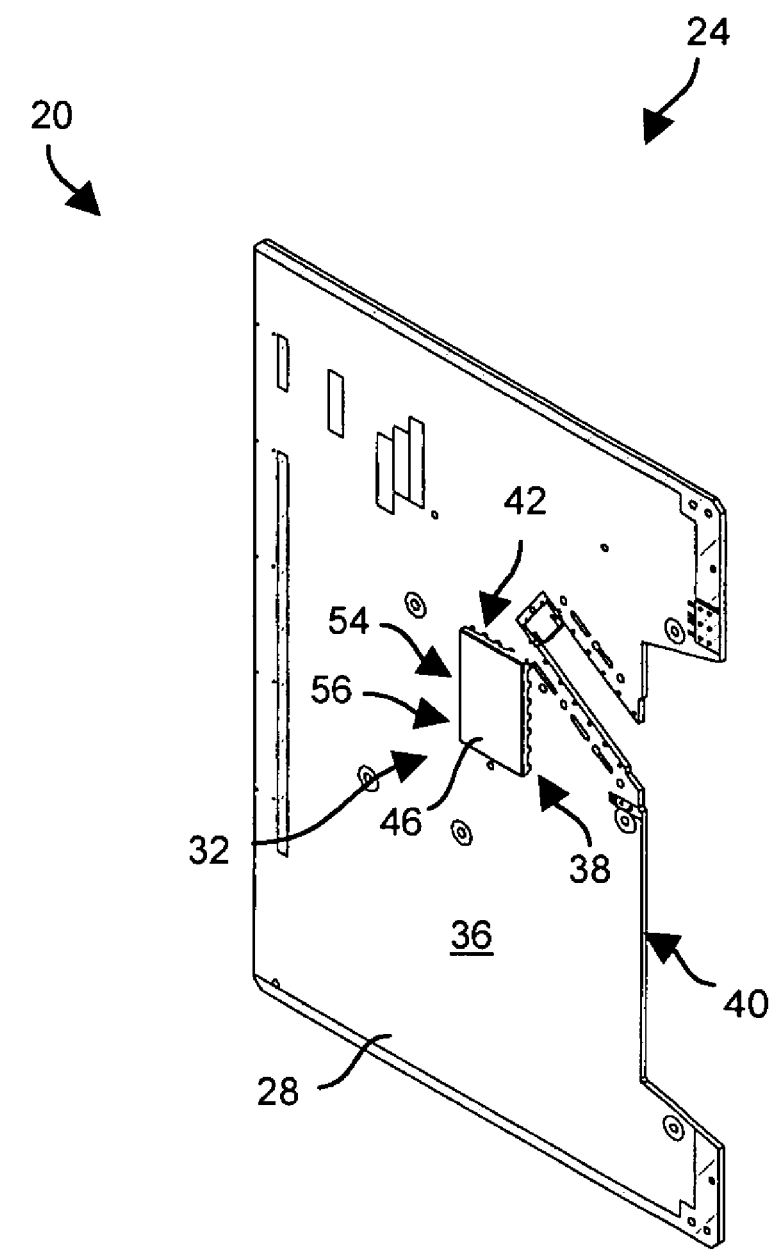
FIG. 2 is a perspective view of the bottom of the circuit board module of FIG. 1.
Figure 3:
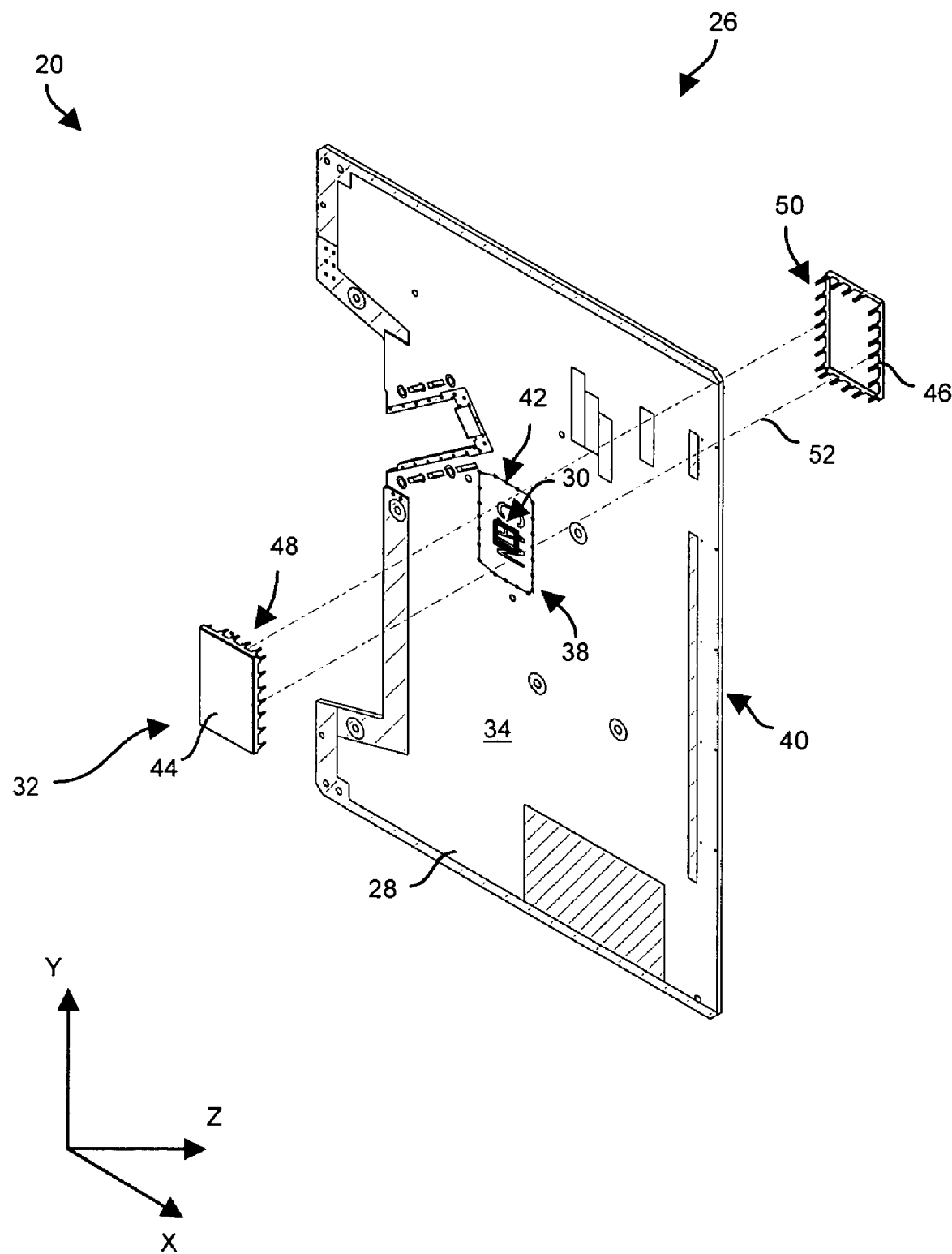
FIG. 3 is an exploded view of the circuit board module of FIGS. 1 and 2.

FIGS. 1 through 3 show a circuit board module 20 which enjoys robust EMI shielding from multiple EMI shielding members configured to attach to the circuit board at the same set of circuit board holes. FIG. 1 shows a perspective view 22 of the circuit board module 20 from a first angle. FIG. 2 shows a perspective view 24 of the circuit board module 20 from a second angle which is opposite that of FIG. 1. FIG. 3 is an exploded view 26 of the circuit board module 20.

As shown in FIGS. 1 through 3, the circuit board module 20 includes a circuit board 28, a circuit board component 30 (FIG. 3), and an EMI shield assembly 32. The circuit board 28 defines a top side 34 (FIG. 1), a bottom side 36 (FIG. 2) and a set of plated through holes (PTHs) 38. The top and bottom sides 34, 36 substantially extend along the X-Y plane. The PTHs 38 extend perpendicularly relative to the sides 34, 36 along the Z-axis, and entirely through the circuit board 28 between the sides 34, 36. Preferably, the PTHs 38 electrically connect to a ground plane 40 (generally illustrated by the arrow 40 in FIGS. 1-3) within the circuit board 28.

The circuit board component 30 (e.g., high frequency circuitry within an Area Array Package) mounts to a component mounting location 42 (e.g., an array of SMT pads) on the top side 34 of the circuit board 28 (see FIG. 3). The EMI shield assembly 32 includes a metallic top EMI shield 44 and a metallic bottom EMI shield 46. The top EMI shield 44 and the bottom EMI shield 46 are configured to substantially enclose both the component mounting location 42 and the circuit board component 30 to provide EMI shielding substantially around that portion of the circuit board 28 and the component 30. In particular, metallic contacts 48 of the top EMI shield 44 insert into the holes 38 in a first direction (i.e., the positive Z-direction) from the top side 34 toward the bottom side 36. Similarly, metallic contacts 50 of the bottom EMI shield 46 simultaneously insert into the same holes 38 in a second direction (i.e., the negative Z-direction) from the bottom side 36 toward the top side 34. Such sharing of the same PTHs 38 (see the matching of sight lines 52 in FIG. 3) makes optimum use of circuit board real estate.

It should be understood that once the top and bottom EMI shields 44, 46 are in place on the circuit board 28, the top and bottom EMI shields 44, 46 contemporaneously encase the circuit board mounting location 42 and the circuit board component 30. Such a configuration provides a robust Faraday cage which encloses even the vias of the mounting location 42 and their associated anti-pads for effective EMI containment.

Moreover, the presence of multiple EMI shields 44, 46 enables the enclosed space 54 (shown generally by the arrow 54 in FIGS. 1 and 2) formed by the shields 44, 46 to be relatively large and thus provide EMI shielding to multiple circuit board components 30. For example, other components 56 (shown generally by the arrow in FIG. 2) may mount to the bottom side 36 of the circuit board 28 (e.g., a set of discrete power conditioning devices such as de-coupling capacitors, resistors, diodes, etc.), and thus enjoy EMI shielding within the enclosed space 54 as well. Further details will now be provided with reference to FIGS. 4 through 6.

Figure 4:
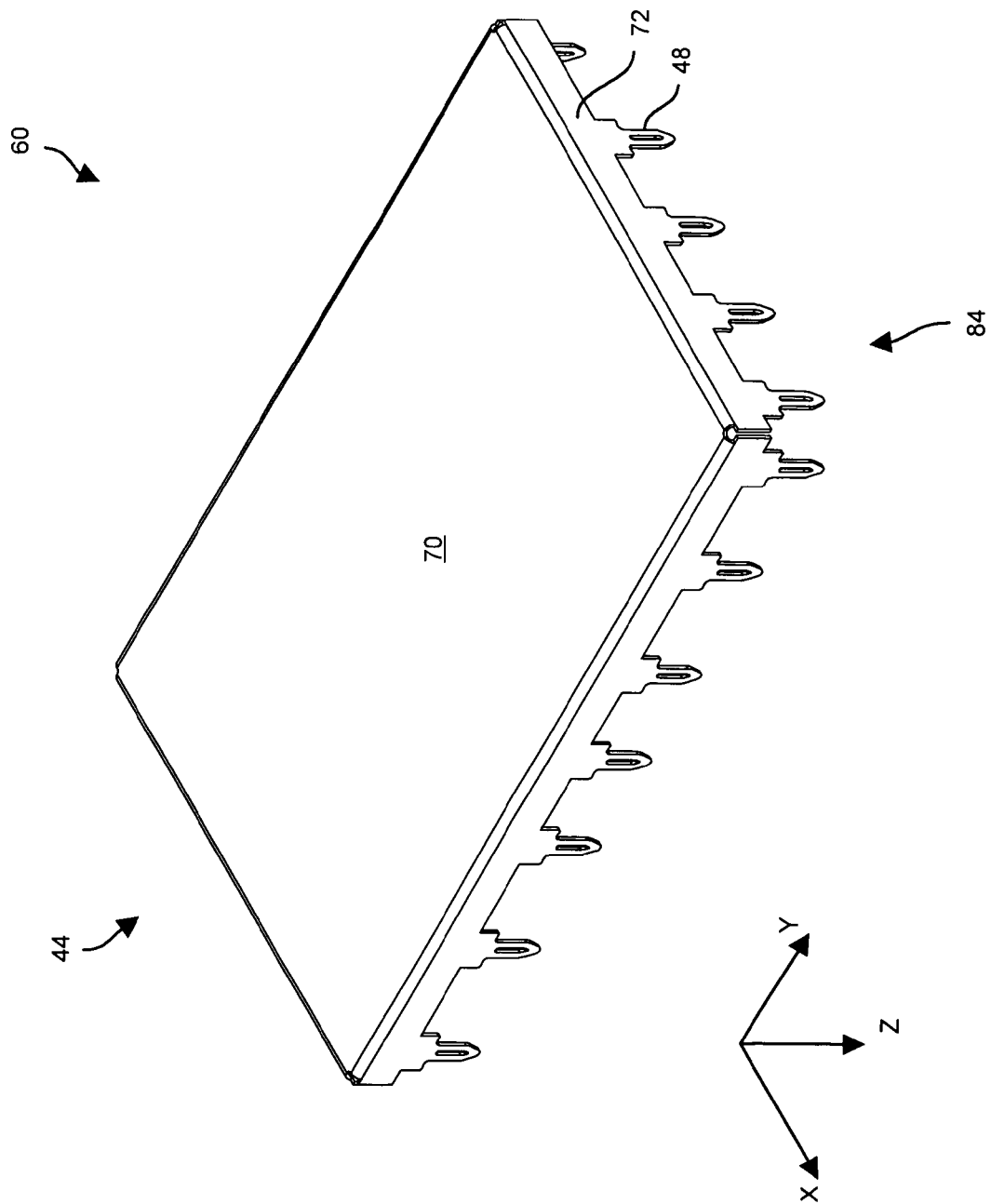
FIG. 4 is a perspective view of a top shield of the circuit board module of FIGS. 1-3.
Figure 5:
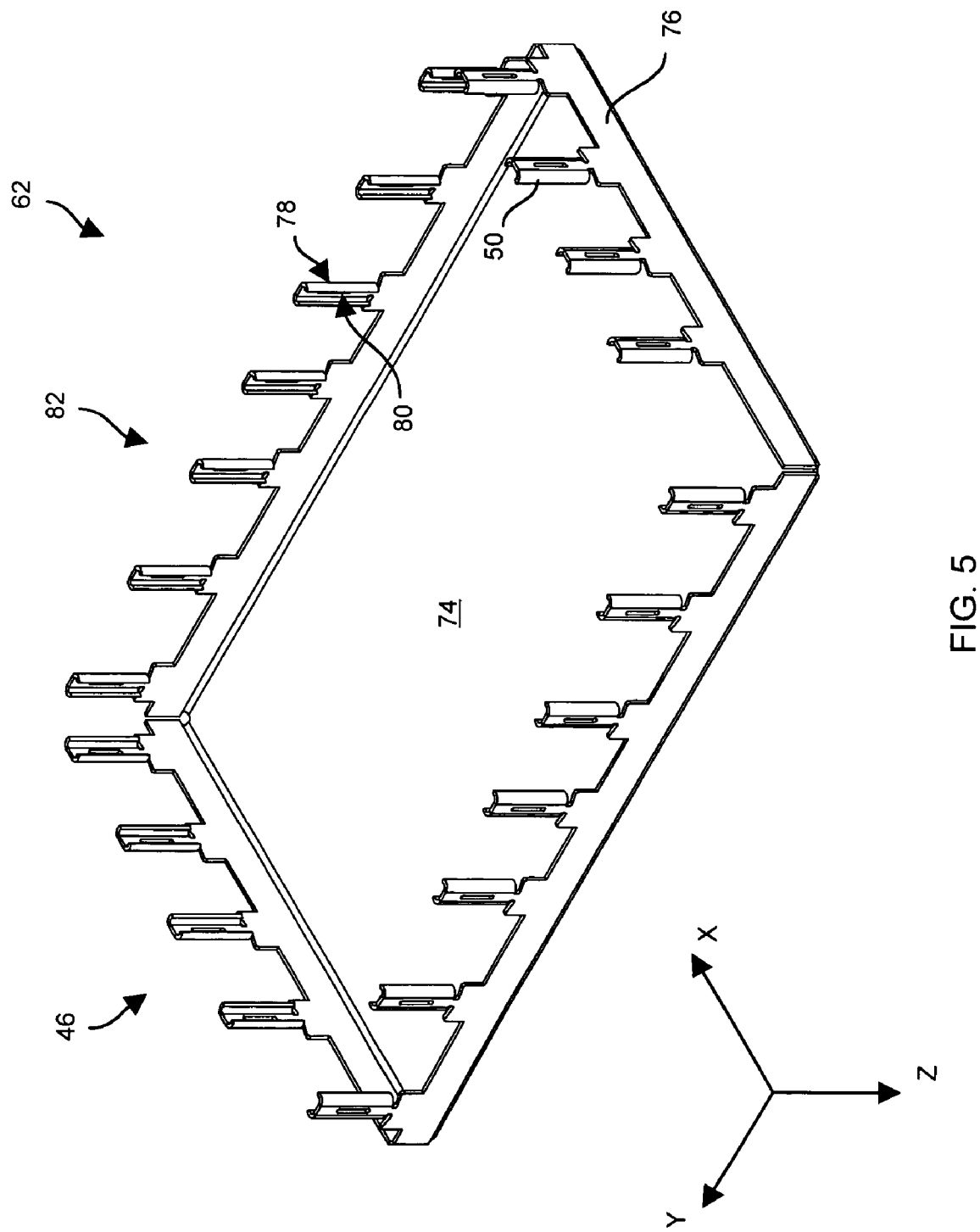
FIG. 5 is a perspective view of a bottom shield of the circuit board module of FIGS. 1-3.
Figure 6:
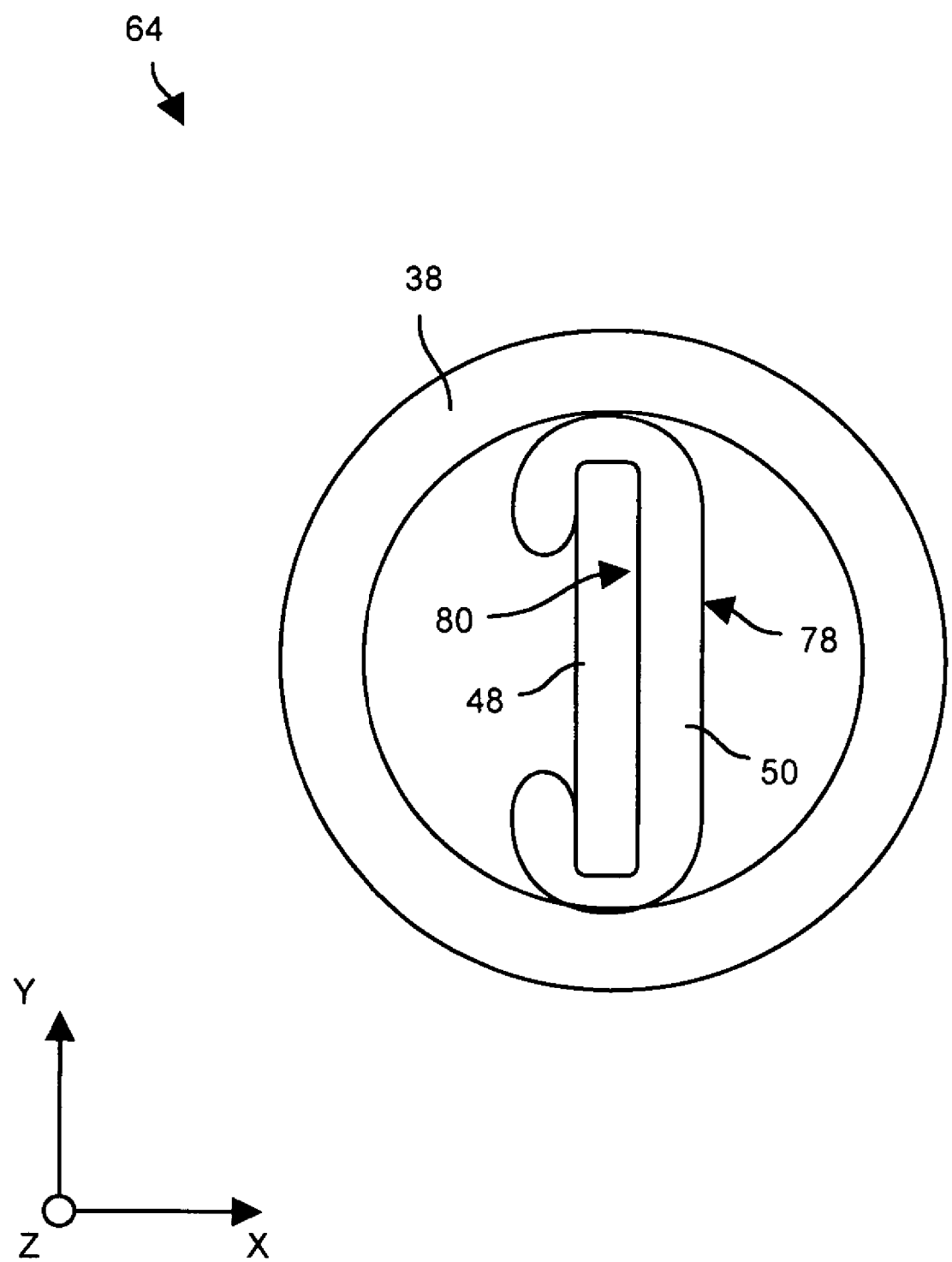
FIG. 6 is a cross-section view of a plated through hole of the circuit board module of FIGS. 1-3.

FIGS. 4 through 6 illustrate particular details of the EMI assembly 32 of the circuit board module 20. FIG. 4 is a perspective view 60 of the top EMI shield 44. FIG. 5 is a perspective view 62 of the bottom EMI shield 46. FIG. 6 is a cross-sectional view 64 of a plated through hole 38 of the circuit board 28 when both the top EMI shield 44 and the bottom EMI shield 46 are properly installed on the circuit board 28.

As shown in FIG. 4, the top EMI shield 44 includes a planar section 70, periphery side sections 72, and the earlier-mentioned set of contacts 48. The planar section 70 is rectangular in shape (i.e., extends in the X-Y plane), and supports the periphery side sections 72. The contacts 48 extend from the periphery side sections 72 in a common direction (i.e., the positive Z-direction). Each contact 48 is configured to press-fit within a corresponding plated through hole 38 of the circuit board 28 (FIGS. 1-3) when inserted into the circuit board 28. In particular, the contacts 48 are compliant eye-of-the-needle pins.

Similarly, as shown in FIG. 5, the bottom EMI shield 46 includes a planar section 74, periphery side sections 76, and the earlier-mentioned set of contacts 50. The planar section 74 is also rectangular in shape (i.e., extends in the X-Y plane), and supports the periphery side sections 76. The contacts 50 extend from the periphery side sections 76 in a common direction (i.e., the negative Z-direction). Each contact 50 is configured to press-fit within a corresponding plated through hole 38 of the circuit board 28 (FIGS. 1-3) when inserted into the circuit board 28. In particular, the contacts 50 of the bottom EMI shield 46 are compliant C-shaped sockets which are further configured to receive the compliant eye-of-the-needle pins of the top EMI shield 44. Along these lines, each contact 50 of the bottom EMI shield 46 has an outer surface 78 configured to directly contact a PTH 38, and an inner surface 80 configured to directly contact a compliant eye-of-the-needle pin of the top EMI shield 44 (see FIG. 5).

It should be understood that the contacts 48 of the top EMI shield 44 and the contacts 50 of the bottom shield 46 are capable of co-occupying the same PTHs 38 of the circuit board 28. As such, the socket contacts 50 of the bottom EMI shield 46 form a bottom shield contact pattern 82 (FIG. 5), and the pin contacts 48 of the top EMI shield 44 form a top shield contact pattern 84 (FIG. 4) which mirrors the bottom shield pattern 82 (also see FIG. 3). Since the contacts 50 of the bottom EMI shield 46 are C-shaped sockets, the bottom EMI shield 46 is equipped to install onto the circuit board 28 before installation of the top EMI shield 44. Further details of such installation will now be explained.

To install the bottom EMI shield 46 onto the circuit board 28, the planar section 74 is positioned over the bottom side 36 of the circuit board 28 and the contacts 50 are aligned with the plated through holes 38 (also see FIG. 3). The bottom EMI shield 46 is then moved toward the circuit board 28 (in the negative Z-direction in FIG. 3) so that each contact 50 compresses within a corresponding PTH 38. Here, the outer surface 78 of each C-shaped socket directly contacts and presses against the surface of the corresponding PTH 38 until that C-shaped socket complies with the PTH 38. At this point, each contact 50 is tightly wedged within its associated PTH 38 to provide a friction fit that prevents the bottom EMI shield 46 from inadvertently escaping (e.g., due to vibration).

Next, to install the top EMI shield 44 onto the circuit board 28, the planar section 70 is positioned over the top side 34 of the circuit board 28 and the contacts 48 are aligned with the plated through holes 38 of the circuit board 28 and the C-shaped sockets of the bottom EMI shield 46 (also see FIG. 3). The top EMI shield 44 is then moved toward the circuit board 28 (in the positive Z-direction in FIG. 3) so that each contact 48 compresses within a corresponding PTH 38 and a corresponding contact 50 of the bottom EMI shield 46. Here, the outer surface of each eye-of-the-needle pin of the top EMI shield 44 directly contacts and presses against the inner surface 80 of the corresponding contact 50 until that eye-of-the-needle pin compresses within the contact 50. As a result, each contact 48 is tightly wedged within its associated contact 50 to provide a friction fit that prevents the top EMI shield 44 from inadvertently escaping (e.g., due to vibration).

FIG. 6 shows a PTH 38 with both a contact 50 of the bottom EMI shield 46 and a contact 48 of the top EMI shield 44 engaged therein. As shown in FIG. 6, the contact 50 has a C-shaped cross-section and the outer surface 78 of the contact 50 presses directly against the side 82 of the PTH 38 for robust electrical connectivity. Additionally, the contact 48 of the top EMI shield 44 presses directly against the inner side 80 of the contact 50 for robust electrical connectivity with both the bottom EMI shield 46 and the PTH 38 of the circuit board.

It should be understood that once the EMI shields 44, 46 are in their installed positions, the EMI shields 44, 46 form a Faraday cage around the circuit board components 30, 56 within the space 54 for effective EMI shielding (also see FIGS. 1-3). Nevertheless, the shields 44, 46 are capable of being removed from the circuit board 28 at a later time (e.g., for rework, to directly access the components 30, 56 or the circuit board portion 42 containing within the space 54, etc.). For example, a user is capable of removing each EMI shield 44, 46 using an extraction tool. Furthermore, due to the press-fit compliant nature of the contacts 48, 50, there is no solder required to attach the EMI assembly 32 and thus no risk of causing a solder short due to solder reflow.

As described above, embodiments of the invention are directed to EMI shielding techniques which utilize a top EMI shield 44 and a bottom EMI shield 46 that attach to a circuit board 28 using the same set of circuit board holes 38. Such techniques enable robust EMI shielding while minimizing consumption of circuit board real estate.

While this invention has been particularly shown and described with references to preferred embodiments thereof, it will be understood by those skilled in the art that various changes in form and details may be made therein without departing from the spirit and scope of the invention as defined by the appended claims.

For example, the circuit board module 20 is capable of supporting multiple components 30, 56 under each EMI shield 44, 46. In such a situation, all of the components 30, 56 enjoy containment within a common Faraday cage formed by the EMI shields 44, 46.

Additionally, it should be understood that the bottom shield 46 was described as having C-shaped sockets, and the top shield 44 was described as having eye-of-the-needle pins. Other configurations are suitable for use as well. For example, in another arrangement, the top shield 44 has C-shaped sockets, and the bottom shield 46 has eye-of-the-needle pins. In yet another arrangement, the eye-of-the-needle pins are replaced by a different type of pin such as a cylindrical post.

Furthermore, it should be understood that the EMI assembly 32 was described above as installing onto the circuit board 28 in a press fit manner. Other mounting technologies are suitable as well. For example, in one arrangement, one or both of the EMI shields 44, 46 are soldered in place within the PTHs 38 such as by using printed solder paste, solder donuts, etc. Such modifications and enhancements are intended to belong to various embodiments of the invention.

What is claimed is:

1. A circuit board module, comprising:
   a circuit board defining a top side, a bottom side and a set of holes extending through the circuit board between the top side and the bottom side;
   a circuit board component mounted to a portion of the circuit board; and
   an electromagnetic interference shield assembly configured to provide electromagnetic interference shielding on the circuit board, the electromagnetic interference shield assembly including:
   a top shield, and
   a bottom shield, the top shield and the bottom shield being configured to substantially enclose the portion of the circuit board to provide electromagnetic interference shielding substantially around the portion of the circuit board when (i) contacts of the top shield insert into the set of holes defined by the circuit board in a first direction from the top side toward the bottom side, and (ii) contacts of the bottom shield simultaneously insert into the same set of holes defined by the circuit board in a second direction from the bottom side toward the top side;
   wherein the top shield and the bottom shield are configured to contemporaneously encase the portion of the circuit board and the circuit board component;
   wherein the contacts of the top shield and the contacts of the bottom shield are configured to press-fit into the set of holes defined by the circuit board; and
   wherein the contacts of the bottom shield are sockets which compress within the set of holes defined by the circuit board; and wherein the contacts of the top shield are pins configured to insert into the sockets.

2. A circuit board module as in claim 1 wherein the sockets of the bottom shield form a bottom shield contact pattern; and wherein the pins of the top shield form a top shield contact pattern which mirrors the bottom shield pattern.

3. A circuit board module as in claim 2 wherein the sockets of the bottom shield have C-shaped cross-sections.

4. A circuit board module as in claim 3 wherein the pins of the top shield are eye-of-the-needle pins.

5. A circuit board module as in claim 4 wherein the sockets of the bottom shield are configured to initially engage the set of holes defined by the circuit board; and wherein the pins of the top shield are configured to subsequently engage the sockets of the bottom shield to form a Faraday cage around the circuit board component.

6. A circuit board module as in claim 5 wherein the bottom shield is in direct physical contact with the circuit board; and wherein the top shield is in direct physical contact with the bottom shield when forming the Faraday cage.

7. A circuit board module as in claim 1 wherein the circuit board component is solder mounted to the portion of the circuit board; wherein another circuit board component is solder mounted to the portion of the circuit board to provide multiple circuit components which are solder mounted to the circuit board; and wherein the top shield and the bottom shield are configured to simultaneously encase the multiple circuit board components which are solder mounted to the portion of the circuit board.

8. A circuit board module as in claim 1 wherein the circuit board component is an Area Array Package holding high frequency circuitry; and wherein the top and bottom shields are constructed and arranged to substantially enclose the Area Array Package holding the high frequency circuitry.

9. An electromagnetic interference shield assembly to provide electromagnetic interference shielding on a circuit board defining a top side, a bottom side and a set of holes extending through the circuit board between the top side and the bottom side, the electromagnetic interference shield assembly comprising:

a top shield; and a bottom shield, the top shield and the bottom shield being configured to substantially enclose a portion of the circuit board to provide electromagnetic interference shielding substantially around the portion of the circuit board when (i) contacts of the top shield insert into the set of holes defined by the circuit board in a first direction from the top side toward the bottom side, and (ii) contacts of the bottom shield simultaneously insert into the same set of holes defined by the circuit board in a second direction from the bottom side toward the top side;

wherein a circuit board component is mounted to the portion of the circuit board; and wherein the top shield and the bottom shield are configured to contemporaneously encase the portion of the circuit board and the circuit board component;

wherein the contacts of the top shield and the contacts of the bottom shield are configured to press-fit into the set of holes defined by the circuit board; and wherein the contacts of the bottom shield are sockets which compress within the set of holes defined by the circuit board; and wherein the contacts of the top shield are pins configured to insert into the sockets.

10. An electromagnetic interference shield assembly as in claim 9 wherein the sockets of the bottom shield form a bottom shield contact pattern; and wherein the pins of the top shield form a top shield contact pattern which mirrors the bottom shield pattern.

11. An electromagnetic interference shield assembly as in claim 10 wherein the sockets of the bottom shield have C-shaped cross-sections.

12. An electromagnetic interference shield assembly as in claim 11 wherein the pins of the top shield are eye-of-the-needle pins.

13. An electromagnetic interference shield assembly as in claim 12 wherein the sockets of the bottom shield are configured to initially engage the set of holes defined by the circuit board; and wherein the pins of the top shield are configured to subsequently engage the sockets of the bottom shield to form a Faraday cage around the circuit board component.

14. An electromagnetic interference shield assembly as in claim 13 wherein the bottom shield is in direct physical contact with the circuit board; and wherein the top shield is in direct physical contact with the bottom shield when forming the Faraday cage.

15. An electromagnetic interference shield assembly as in claim 9 wherein the circuit board component is solder mounted to the portion of the circuit board; wherein another circuit board component is solder mounted to the portion of the circuit board to provide multiple circuit board components which are solder mounted to the circuit board; and wherein the top shield and the bottom shield are configured to simultaneously encase the multiple circuit board components which are solder mounted to the portion of the circuit board.

16. An electromagnetic interference shield assembly as in claim 9 wherein the circuit board component is an Area Array Package holding high frequency circuitry; and wherein the top and bottom shields are constructed and arranged to substantially enclose the Area Array Package holding the high frequency circuitry.

17. A circuit board module, comprising:

a circuit board defining a top side, a bottom side and a set of holes extending through the circuit board between the top side and the bottom side;

electronic circuit means for performing electronic operations; and an electromagnetic interference shield assembly configured to provide electromagnetic interference shielding on the circuit board, the electromagnetic interference shield assembly including:

a top shield, and a bottom shield, the top shield and the bottom shield being configured to substantially enclose the portion of the circuit board and the electronic circuit means to provide electromagnetic interference shielding substantially around the portion of the circuit board and the electronic circuit means when (i) contacts of the top shield insert into the set of holes defined by the circuit board in a first direction from the top side toward the bottom side, and (ii) contacts of the bottom shield simultaneously insert into the same set of holes defined by the circuit board in a second direction from the bottom side toward the top side;

wherein the top shield and the bottom shield are configured to contemporaneously encase the portion of the circuit board and the electronic circuit means;

wherein the contacts of the top shield and the contacts of the bottom shield are configured to press-fit into the set of holes defined by the circuit board; and wherein the contacts of the bottom shield are sockets which compress within the set of holes defined by the circuit board; and wherein the contacts of the top shield are pins configured to insert into the sockets.

18. A circuit board module as in claim 17 wherein the electronic circuit means is an Area Array Package holding high frequency circuitry; and wherein the top and bottom shields are constructed and arranged to substantially enclose the Area Array Package holding the high frequency circuitry.

19. A circuit board module as in claim 17 wherein the electronic circuit means includes multiple circuit board components which are solder mounted to the portion of the circuit board; and wherein the top shield and the bottom shield are configured to simultaneously encase the multiple circuit board components which are solder mounted to the portion of the circuit board.

* * * * *